US012677396B2

(12) United States Patent
Dewey et al.

(10) Patent No.: US 12,677,396 B2
(45) Date of Patent: Jul. 7, 2026

(54) HEATSINK WITH PHASE CHANGING PLUGS AND EXTINGUISHING COOLANT

(71) Applicant: International Business Machines Corporation, Armonk, NY (US)

(72) Inventors: Alexandra Dewey, Ijamsville, MD (US); Jennifer I. Bennett, Rochester, MN (US); Theron Lee Lewis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/178,755

(22) Filed: Mar. 6, 2023

(65) Prior Publication Data

US 2024/0306347 A1     Sep. 12, 2024

(51) Int. Cl.
H05K 7/20 (2006.01)

(52) U.S. Cl.
CPC ....... H05K 7/2039 (2013.01); H05K 7/20272 (2013.01)

(58) Field of Classification Search
CPC ......... H05K 1/0201–0203; H05K 7/20; H05K 7/20254; H05K 7/20263; H05K 7/20272;
(Continued)

(56) References Cited

U.S. PATENT DOCUMENTS

| | | |
|---|---|---|
| 5,283,715 A | 2/1994 | Carlsten |
| 6,021,044 A | 2/2000 | Neville, Jr. |

(Continued)

FOREIGN PATENT DOCUMENTS

| | | |
|---|---|---|
| EP | 2422594 A1 | 2/2012 |
| EP | 4677645 A1 | 1/2026 |

(Continued)

OTHER PUBLICATIONS

International Search Report and Written Opinion for International Application No. PCT/EP2024/055098, dated Jun. 10, 2024, 10 pages.

(Continued)

*Primary Examiner* — Amir A Jalali
(74) *Attorney, Agent, or Firm* — Stephen R. Yoder

(57) ABSTRACT

An apparatus and method for extinguishing a thermal runaway in an electronic component is provided. The apparatus comprises a heatsink affixed to the electronic component, a reservoir containing coolant, and one or more Phase Change Material (PCM) plugs blocking coolant contained in the reservoir, where the PCM plugs, in response to the electronic component being at an approximate temperature of the Phase Change Temperature (PCT) of the PCM plugs, melt, thereby causing coolant to being dispersed onto the electronic component. The method comprises, in response to the electronic component reaching a temperature indicative of a thermal runaway event occurring in the electronic component, melting one or more phase change material (PCM) plugs, wherein the PCM plugs block coolant from draining out of a reservoir. In response to the PCM plugs melting, releasing the coolant from the reservoir onto the electronic component to extinguish the thermal runaway event.

11 Claims, 6 Drawing Sheets

(58) Field of Classification Search
CPC ............. H05K 7/20282; H05K 7/2029; H05K 7/2039; H05K 7/20409; H05K 7/20454; H05K 7/20663; H05K 7/208; H05K 7/20881; H05K 7/20936; H05K 7/20945; H05K 7/2099; H10W 40/30; H10W 40/73–735; G06F 1/20; G06F 1/206; G06F 1/266; G06F 2200/201
See application file for complete search history.

(56) References Cited

U.S. PATENT DOCUMENTS

| | | | | |
|---|---|---|---|---|
| 6,317,321 | B1 | 11/2001 | Fitch | |
| 6,498,725 | B2 * | 12/2002 | Cole | H10W 40/475 |
| | | | | 165/104.31 |
| 6,550,263 | B2 * | 4/2003 | Patel | H10W 40/475 |
| | | | | 165/80.4 |
| 6,889,756 | B1 | 5/2005 | Hou | |
| 6,995,980 | B2 | 2/2006 | Tustaniwskyj | |
| 8,322,154 | B2 | 12/2012 | Campbell | |
| 9,852,963 | B2 | 12/2017 | Shedd | |
| 10,177,075 | B2 | 1/2019 | Bezama | |
| 10,575,393 | B1 | 2/2020 | Bennett | |
| 11,031,317 | B2 | 6/2021 | Joshi | |
| 11,889,663 | B1 * | 1/2024 | Liu | H05K 7/20236 |
| 2002/0033247 | A1 | 3/2002 | Neuschutz | |
| 2004/0159422 | A1 | 8/2004 | Zuo | |
| 2010/0328888 | A1 * | 12/2010 | Campbell | H10W 40/475 |
| | | | | 361/699 |
| 2013/0316198 | A1 | 11/2013 | Bandhauer | |
| 2015/0131228 | A1 * | 5/2015 | Ishikawa | H05K 7/20827 |
| | | | | 361/699 |
| 2015/0181756 | A1 * | 6/2015 | Sato | F28D 15/06 |
| | | | | 165/64 |
| 2018/0145381 | A1 * | 5/2018 | Dinh | H05K 7/20881 |
| 2019/0118312 | A1 | 4/2019 | Bennett | |
| 2019/0181071 | A1 | 6/2019 | Harris | |
| 2019/0308048 | A1 | 10/2019 | O'Hara | |
| 2019/0359871 | A1 | 11/2019 | Hartmann | |
| 2020/0205315 | A1 * | 6/2020 | Ding | H05K 7/20281 |
| 2020/0350231 | A1 | 11/2020 | Shen | |
| 2021/0131740 | A1 | 5/2021 | Joshi | |
| 2023/0110020 | A1 * | 4/2023 | Graham | H05K 7/2039 |
| | | | | 174/252 |
| 2023/0232588 | A1 * | 7/2023 | Moriyama | B64G 1/503 |
| | | | | 62/3.2 |
| 2024/0057284 | A1 * | 2/2024 | Chen | H05K 7/208 |

FOREIGN PATENT DOCUMENTS

| | | |
|---|---|---|
| KR | 101956370 B1 | 3/2019 |
| WO | 2020189900 A1 | 9/2020 |
| WO | 2024/184152 A1 | 9/2024 |

OTHER PUBLICATIONS

"11 Heat Sink Types", Pioneer Thermal Heat Sinks, Jan. 24, 2022, 11 pages, <https://www.heatsinksmfg.com/article-show-235-392.html#:~:text=11-heat-sink-types>.

"ANSUL—Product Detail", accessed on Sep. 23, 2022, 4 pages, <https://www.ansul.com/en/us/pages/ProductDetail.aspx?productdetail/>.

"Dynalene LC-PG", Low electrical conductivity, inhibited propylene glycol/water-based coolant, Dynalene, Inc., Published Jul. 2020, 5 pages.

"Fire suppression—Novec 1230 Fire Protection Fluid", 3M, © 3M 2022, 8 pages, <https://www.3m.com/3M/en_US-hovec-us/applications/fire-supression/>.

"FM-200™ Fire Suppressant", Chemours, access on Sep. 23, 2022, 3 pages, https://www.chemours.com/en/brands-and-products/fire-suppressants/support/contact>.

"Heatsink—what is a heatsink? how it works, and types available", radian, 2022 © Radian, 14 pages, <https://www. radianheatsinks.com/heatsink/>.

"Inhibited Glycol Coolant For Fuel Cells and Electronics Cooling—Dynalene FC", accessed on Sep. 23, 2022, 3 pages, <https://www.dynalene.com/product-category/heat-transfer-fluids/dynale-fc>.

"PCM—PlusICE Hydrated Salt (S) Range", printed on Sep. 23, 2022, 6 pages, <www.pcmproducts.net>.

"Phase Change Material | Thermal Management", accessed on Sep. 23, 2022, 7 pages, <https://www.thermalmgt.com/phase-change-material/>.

"The Difference Between Radiator and Water Cooling Plate", KINGKA, Sep. 14, 2020, 4 pages, <https://www.kingkatech.com/the-difference-between-radiator-and-water-cooling-plate>.

"What is a Heatpipe Heatsink?", What are they, and how do you use them?, Santa Clara, CA, 2022 © Radian, <https://www.radianheatsinks.com/heatpipe/#:~:text=What%20is%20a>.

Koorsen Fire & Security, "What is a Class C Fire Extinguisher Used For?", © 2022 Koorsen Fire & Security, 8 pages, <https://blog.koorsen.com/what-is-a-class-c-fire-extinguisher-used-for>.

Linquip Team, "Phase Change Material: Example and Applications", Aug. 10, 2021, Copyright © 2022 Linquip Company, 18 pages, <https://www.linquip.com/blog/what-is-phase-change-material/>.

Noel et al., "Phase Change Material", Storing Energy (Second Edition), 2022, ScienceDirect, 17 pages.

O'Connor, Brian, "Fire Extinguisher Types | NFPA", National Fire Protection Association, Jul. 16, 2021, 6 pages.

Wang et al., "3D Integrated Circuit Cooling with Microfluidics", Micromachines 2018, MDPI, Published: Jun. 7, 2018, 14 pages.

* cited by examiner

HEATSINK WITH PHASE CHANGING PLUGS AND EXTINGUISHING COOLANT

BACKGROUND OF THE INVENTION

The present invention relates generally to the field of heatsinks from electronic components, and more particularly to extinguishing a thermal runaway event that may occur within the electronic components.

Heatsinks provide the necessary cooling for electronic components by transferring or dissipating heat from the component to the heatsink. To accomplish this, heatsinks are typically metal structures to draw heat from hot electronic components. Most heatsinks have fins or other structural arrangements to dissipate the transferred heating into the surrounding air faster than the electronic components can achieve on their own. However, various faults in design or manufacturing can lead to the electronic components reaching dangerous temperatures too high for the heatsink to effectively cool the components. These scenarios are often referred to as thermal runaway events as the heat builds up and keeps increasing until the component fails. Due to the heat building up within the component, the component will fail and may cause damage to other neighboring components.

SUMMARY

Embodiments of the present invention are directed towards an apparatus for extinguishing a thermal runaway in an electronic component is provided. The apparatus comprises a heatsink affixed to the electronic component; a reservoir in the heatsink, the reservoir containing coolant and having a drain; and a Phase Change Material (PCM) plug in proximity to the electronic component, the PCM plug affixed to the drain blocking the release of the coolant contained in the reservoir. In response to the electronic component being at an approximate temperature of a Phase Change Temperature (PCT) of the PCM plug, the PCM plug melting thereby allowing release of the coolant to pass through the drain and to disperse onto the electronic component.

Embodiments of the present invention are directed towards a method for extinguishing a thermal runaway in an electronic component is provided. The method comprises affixing a heatsink to an electronic component, the heatsink including a reservoir containing a coolant, a drain for releasing the coolant from the reservoir, and a phase change material (PCM) plug blocking the drain from releasing the coolant; in response to the electronic component reaching a temperature indicative of a thermal runaway event occurring in the electronic component, melting the phase change material (PCM) plug; and in response to the PCM plug melting, releasing the coolant to disperse onto the electronic component thereby extinguishing the thermal runaway event.

DETAILED DESCRIPTION

Figures 1A, 1B:
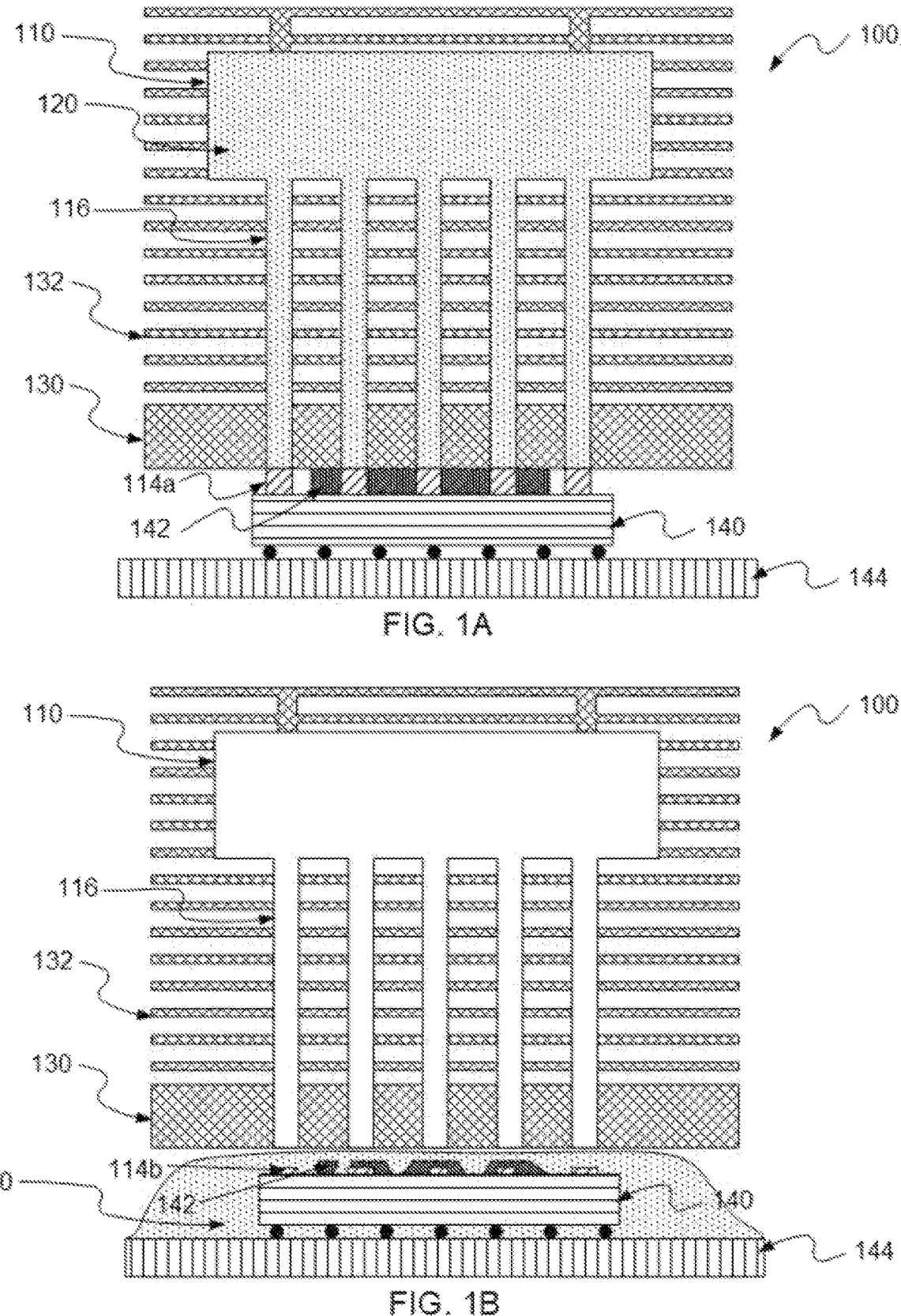
FIGS. 1A & 1B depict a heatsink with extinguishing coolant to prevent thermal runway, in accordance with an embodiment of the present invention.

Embodiments of the present invention are directed to a heatsink with a reservoir containing extinguishing coolant that will prevent thermal runaway events from destroying or damaging other components when a component fails. Prior solution for heatsinks do not present any methodology or structure for containing and dispersing the extinguishing coolant needed to prevent thermal runaway events. Additionally, prior solutions for utilizing extinguishing coolant to prevent damage do so by utilizing external devices and sensors and typically flood the entirety of the device to stop further damage.

Embodiments of the present invention recognize that by incorporating the extinguishing coolant within the heatsink, various improvements to prior solutions are achieved. In various scenarios, the additional coolant within the reservoir of the heatsink will provide additional heat absorption, as with most liquid cooling solutions. Furthermore, the coolant is localized to a component that may incur a thermal runaway event. As such, in case of a runaway, the coolant can be quickly and locally dispersed on the failing component, whereas prior solutions flood the enclosure and do not guarantee quick application of the extinguishing coolant to the offending component.

Furthermore, embodiments of the present invention provide for phase change material (PCM) plugs that hold the extinguishing coolant in the reservoir until a runaway event occurs. Once the component reaches a temperature threshold, the PCM plugs will melt, causing the extinguishing coolant to be dispersed directly on the component. As such, embodiments of the present invention do not require sensors or other active devices to disperse coolant, thereby increasing the reliability of embodiments of the present invention in scenarios where damage to the active sensors of prior solution may fail due to loss of power or other damage.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time. The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIGS. 1A & 1B depict a heatsink with extinguishing coolant, generally designated as 100, to prevent thermal runway. In various embodiments, heatsink 130 includes reservoir 110 which contains coolant 120. In FIG. 1A, phase change material (PCM) plugs 114 are intact (i.e., intact PCM plugs 114a). Each plug 114 is situated at the distal end of drain 116, such that when plugs 114 are intact (i.e., intact PCM plugs 114a), plugs 114 prevent coolant 120 from leaving reservoir 110. When the temperature of the PCM plugs 114 reaches a threshold temperature (i.e., a temperature that is indicative of a thermal runaway event), PCM plugs 114 melt into melted PCM plugs 114b as depicted in FIG. 1B. Once PCM plugs 114 are melted, coolant 120 travels down drain 116 via gravity to deliver coolant to electronic component 140, thereby extinguishing the components and preventing further damage from the thermal runaway event.

In various embodiments, component 140 is any electronic component that produces heat and may suffer from a thermal runaway event if not properly cooled. For example, component 140 may by a central processing unit (CPU), a graphics processing unit (GPU), or an application-specific integration circuit (ASIC) such as a neural network processor. One of ordinary skill in the art will appreciate that heatsink with extinguishing coolant 100 may be affixed to any electronical component where thermal runaway events may occur, such as but not limited to, system memory (i.e., Random Access Memory), solid-state storage devices (SSDs), systems-on-a-chip (SoCs), and programmable circuits, such as Fully Programmable Gate Arrays (FPGAs). In many scenarios, heatsink 130 is affixed to component 140 via thermal paste 142. Thermal paste 142 bonds the component to the heatsink, permitting effective thermal transfer between heatsink 130 and component 140. One of ordinary skill will appreciate that thermal paste 142 can be any thermally conductive chemical compound that promotes heat transfer between heatsink 130 and component 140, such as any polymer with thermally conductive material to bond and encourage said heat transfer. In some embodiments, thermal paste 142 may comprise a pre-cured silicone gel with a specifically highly compliant silicone matrix filled with ceramic filler.

In various embodiments and scenarios, component 140 is affixed or coupled to printed-circuit board (PCB) 144. PCB 144 serves structure to connect component 140 to other devices and components with a device (not shown). If component 140 fails and causes thermal runaway, then component 140 may damage nearby components on PCB 144. By quickly extinguishing thermal runaway events, embodiments of the present invention can stop further damage to the other components. Additionally, by preserving the other components of the PCB 144, fault analysis is improved as diagnosis and identifying the culprit component in the failure will be easier to identify, as the damage does not propagate across other components connected to PCB 144.

In various embodiments, heatsink 130 is any device or structure that provides a heat exchange from component 140 to another medium such as air or liquid. Heatsink 130 is depicted as an air-cooled heat exchange, which typically has fins 132 that extend from the heat sink to better dissipate heat into the surrounding air. In some embodiments, heatsink 130 includes a cooling plate (not shown) for liquid cooling of component 140. In further embodiments, heatsink 130 also includes a heatpipe (not shown) to transfer heat from component 140 to heatsink 130. One of ordinary skill in the art will appreciate that embodiments of the present invention may utilize a variety of heatsinks without deviating from the invention, given that reservoir 110 is connected to component 140 such that coolant 120 can be dispersed onto component 140 if a thermal runaway event occurs.

In various embodiments, heatsink 130 includes a cavity for coolant 120 to be stored. Additionally, drain 116 is enclosed by heatsink 130 such that drain 116 is connected to reservoir 110 and permit flow of coolant 120 onto component 140 during thermal runaway. Coolant 120 can be a variety of coolants or extinguishing media such as, but not limited to, halocarbons (e.g., heptafluoropropane or fluoroketone), glycols, or oxygen-reducing medias, such as pressurized carbon dioxide gas. One of ordinary skill in the art will appreciate that any type of coolant or extinguishing media may be used in reservoir 110 as coolant 120. In various scenarios, coolant 120 should be capable of quickly extinguishing or otherwise stopping a thermal runaway event in component 140 from affecting other components on PCB 144.

In various embodiments, drain 116 leads from reservoir 110 to deposit coolant 120 onto component 140 have at least one phase change material (PCM) plug 114 at the distal end of each drain 116 from reservoir 110. As will be discussed herein, PCM plug 114, when induced to a phase change temperature by heat generated by component 140, will melt thereby unblocking drain 116, allowing release of the coolant 120 in reservoir 110 to be dispersed onto component 140 via gravity once PCM plug 114 melts.

As depicted FIGS. 1A-4B, drain 116 extends from reservoir 110, such that the distal ends of drain 116 are in contact or in close proximity to component 140, to encourage inducted heating of PCM plug 114. Additionally, reservoir 110 is enclosed or otherwise part of heatsink 130 such that coolant 120 can provide some additional heat absorption and efficiency to heatsink 130. One of ordinary skill in the art will appreciate that the location and placement of reservoir 110 and drain 116 may be altered from the configurations and designs depicted in FIGS. 1A-4B. For example, drain 116 may not be a channel extending from reservoir 110, but may be a hole or any other egress point for coolant to be released from reservoir 110 when PCM plug 114 melts. Further alteration to drain 116, such as diverting channels 150 are discussed herein. One of ordinary skill in the art will appreciate that various alterations to the placements, size and arrangements of reservoir 110 and drain 116 can be made based on cooling, budgetary and other needs without deviating from the invention.

Phase change materials are materials that can change states of matter when exposed to certain environmental factors, such as temperature. For example, when the PCM material is at a lower temperature, the material is in a solid form, and when exposed to a higher temperature, the PCM material transitions to a liquid. Ice or frozen water is the classical example of this phenomenon. Modern developments, however, have created a wide arrange of such materials that have different phase change points to accommodate different applications. Where water becomes ice when exposed to roughly 32° F. temperatures, PCMs for use in electronic components need a much higher phase change temperature (PCT).

In various embodiments, depending on the design and structure of component 140, the temperature that would cause thermal runaway and failure of component 140 can vary. Typically for semiconductors, silicon increases in resistance until a breaking point of approximately 160° C. is reached, at which point the semiconductor drastically decrease in resistance, causing excess current and thereby heat to occur, typically leading to thermal runaway. In this scenario, a PCM plug 114 would be selected to have a PCT of approximately 160° C., where the PCM plug 114 would be a solid and intact below the PCT (i.e., intact PCM plugs 114a) and melt when above the PCT (i.e., melted PCM plugs 114b). Example PCM materials that operate with a PCT within this ranged include hydrocarbons and other organic PCMs or salt hydrates and other inorganic PCMs.

Looking to FIG. 1B, PCM plugs 114 have melted (i.e., 114b) due to component 140 reaching or exceeding the PCT of PCM plugs 114. As such, coolant 120 is no longer suspended by intact PCM plugs 114a. Gravity pulls coolant 120 from the reservoir 110 through directing channels 116 to be deposited onto component 140. While component 140 may be damaged due to thermal runaway, surrounding components on PCB 144 may be salvaged by extinguishing the thermal runaway occurring in component 140. Coolant 120 stops the overheating by being directly applied to component 140. While prior solutions may deposit coolant during thermal runaway of a component, said solutions do so for the entire enclosure or device and do not deposit coolant in a localized manner, as discussed herein. By storing coolant 120 within the heat sink, not only does the efficiency of heatsink 130 increase, but the coolant 120 also serves a dual purpose of extinguishing thermal runaways and breakdowns specific components. By deploying a localized amount of coolant to a component that is failing, fault analysis is improved since the only the offending component is covered and extinguished by coolant, since the other non-faulty components are left intact for fault analysis and possible re-use.

Figures 2A, 2B:
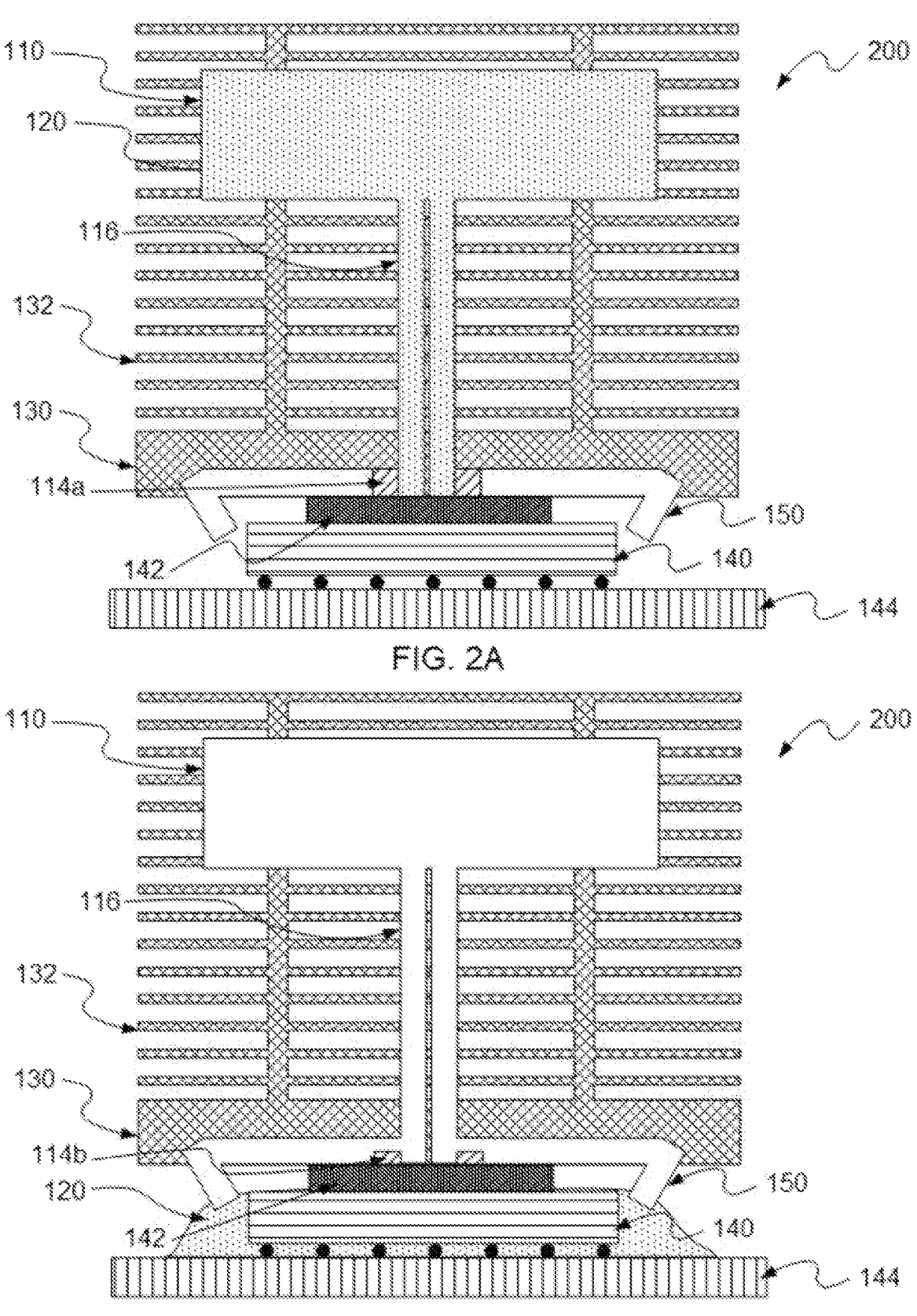
FIGS. 2A & 2B depict a heatsink with extinguishing coolant and piping, in accordance with an embodiment of the present invention.

FIGS. 2A & 2B depicts a heatsink with extinguishing coolant and piping, generally designated 200, in accordance with an embodiment of the present invention. In FIG. 2A, heatsink 130 includes reservoir 110 containing coolant 120. Intact PCM plugs 114 block directing channels 116 from reservoir until heated to a PCT of the material used in PCM plugs 114 (e.g., component 140 has reached approximately the PCT threshold and has induce heat onto intact PCM plugs 114a to reach the PCT, indicating thermal runaway may be occurring in component 140).

In some embodiments, heatsink 130 also includes diverting channels 150. Diverting channels 150 divert coolant in order to be directly applied to component 140. PCM plugs 114 should be placed in close proximity to component 140, as the induced heating of PCM plugs 114 via dissipation by component 140 is needed to induce a phase change to PCM plugs 114. If the distance is too far, then PCM plugs 114 may not melt in the case of a thermal runaway in component 140. Furthermore, thermal paste 142 and other materials or structure may block delivery of coolant 120 onto component 140, possibly impeding coolant 120 flow. As such, in FIG. 2A, intact PCM plugs 114 are located in close proximity to component 140, with only thermal paste 142 and small portions of heatsink 130 being in between the two.

In FIG. 2B, component 140 has reached a temperature approximate to the PCT of PCM plugs 114, causing PCM plugs 114 to become melted PCM plugs 114b and to unblock directing channels 116 from reservoir 110. Without PCM plug 114 blocking directing channels 116, coolant 120 flows into diverting channels 160, which in turn direct coolant directly onto component 140 while diverting coolant from any intervening materials or structure, such as thermal paste 142.

Figures 3A, 3B:
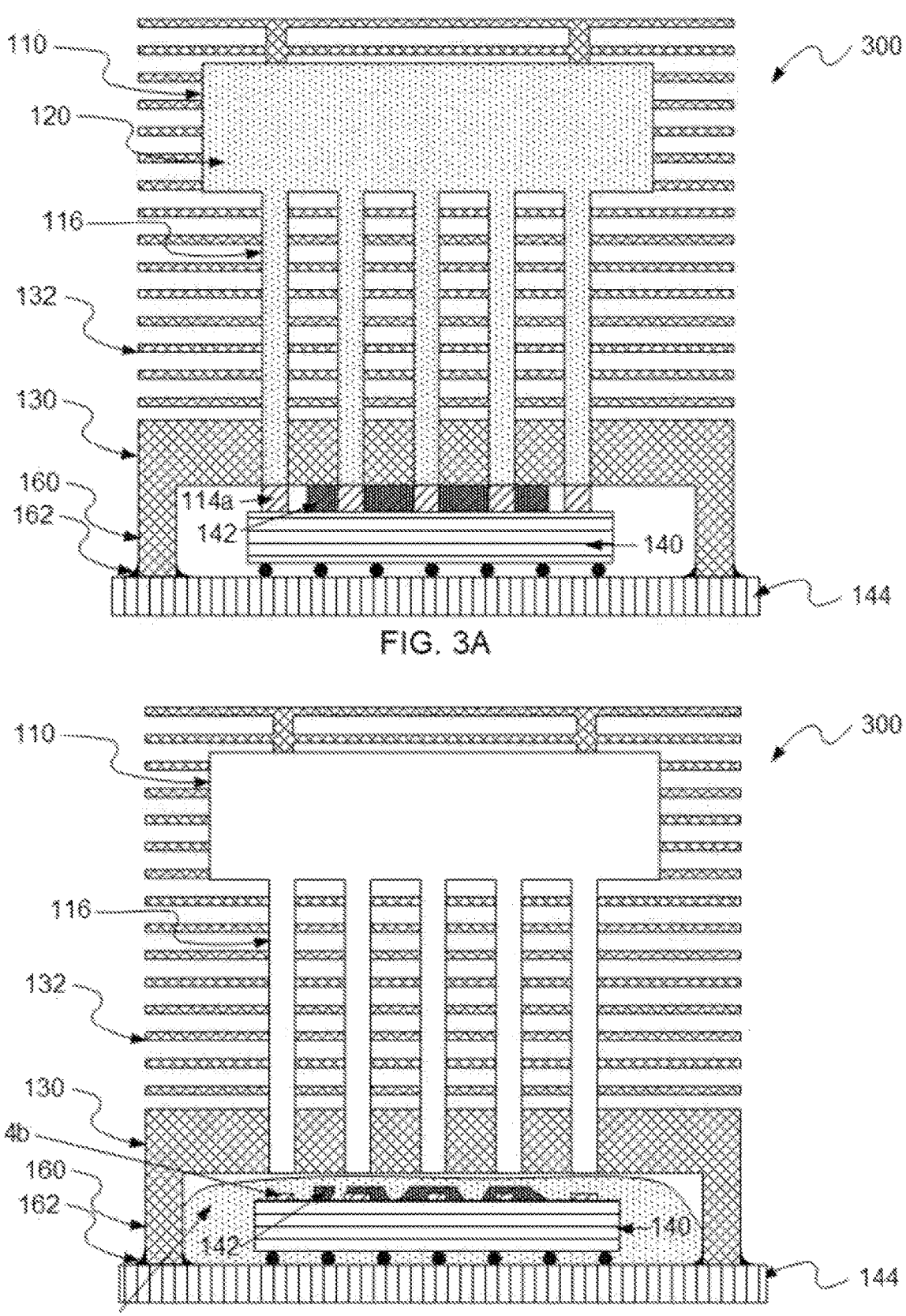
FIGS. 3A & 3B depict a heatsink with extinguishing coolant and containment walls, in accordance with an embodiment of the present invention.

FIGS. 3A & 3B depicts a heatsink with extinguishing coolant and containment walls, generally designated 300, in accordance with an embodiment of the present invention. In FIG. 3A heatsink 130 includes reservoir 110 containing coolant 120. Intact PCM plugs 114 block directing channels 116 from reservoir until heated to a PCT of the material used in PCM plugs 114. In some embodiments, heatsink 130 includes containment walls 160 that surround the bottom perimeter of heatsink 130. While discussed separately, in various embodiments, containment walls 160 are contiguous portion of heatsink 130. Additionally, bottom portion of containment walls 160 are sealed to PCB 144 via sealant 162 to better contain coolant 120 when deployed. In some embodiments, containment walls 160 may not be extrusions or portion thereof heatsink 130. For example, a carbon composite material could be affixed to heatsink 130 and PCB 144 to create containment walls 160 (not shown).

In FIG. 3B, component 140 has reached a temperature approximate to the PCT of PCM plugs 114, causing PCM plugs 114 to become melted PCM plugs 114b and to unblock directing channels 116 from reservoir 110. With containment walls 160 and sealant 162 applied to the surrounding bottom perimeter of heatsink 130, coolant 120 is safely kept within the local area of heatsink 130, thereby limiting any spread of coolant 120 to neighboring components. As with prior solutions that indiscriminately soak components on PCB 144 during thermal runaways, such embodiments where coolant 120 is further contained with containment walls 160 will help in fault analysis and repair of PCB 144 by limiting any damage and cleanup to only the component with heatsink 130.

Figure 4A:
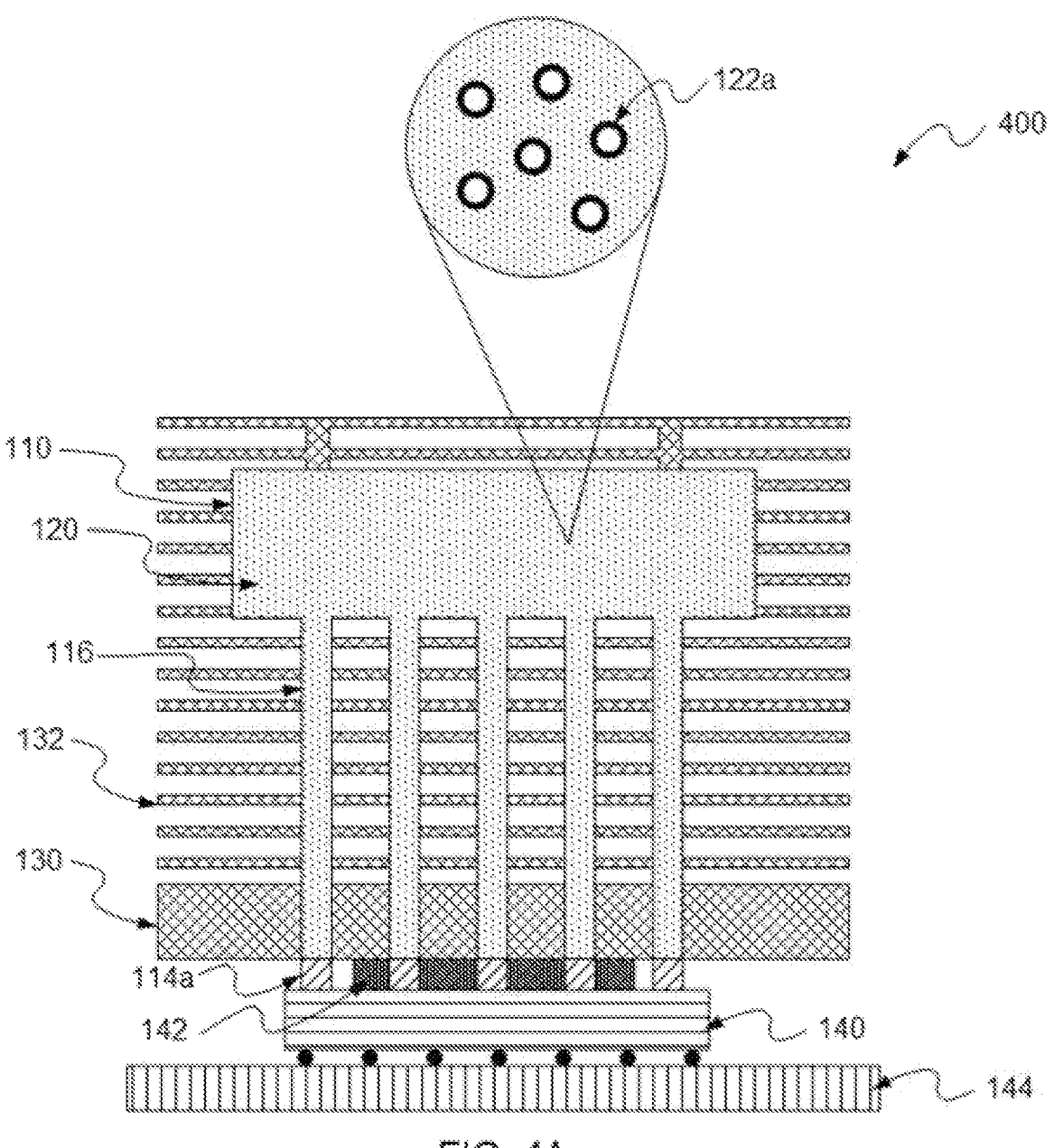
FIGS. 4A & 4B depict a heatsink with extinguishing coolant containing microcapsules, in accordance with an embodiment of the present invention.
Figure 4B:
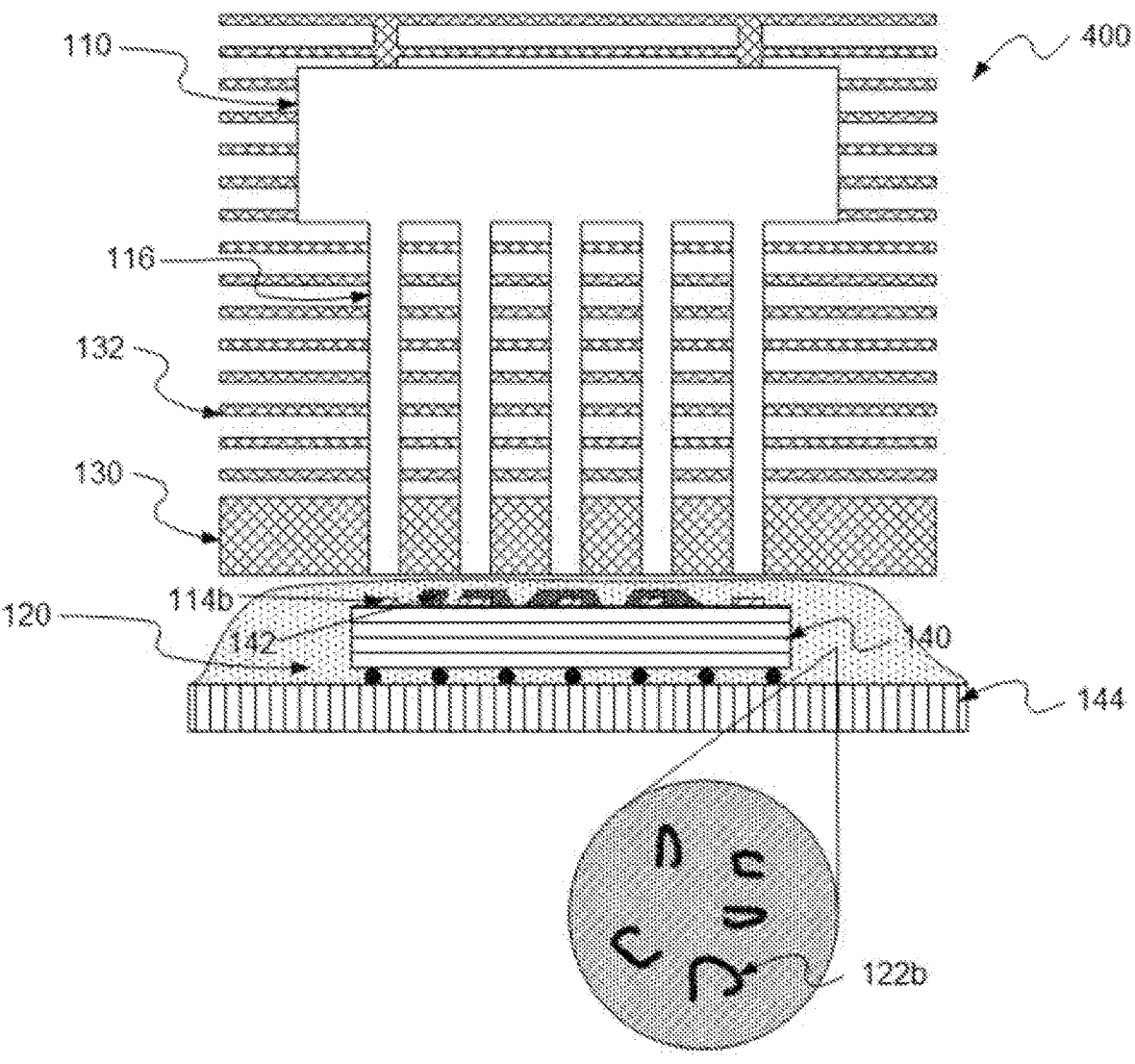

FIGS. 4A & 4B depicts a heatsink with extinguishing coolant containing microcapsules, generally designated 400, in accordance with an embodiment of the present invention. In FIG. 4A heatsink 130 includes reservoir 110 containing coolant 120. Intact PCM plugs 114 block directing channels 116 from reservoir until heated to a PCT of the material used in PCM plugs 114. In some embodiments, coolant 120 includes microcapsules 122a. Microcapsules 122a comprise a shield layer that creates a compartment to store a reactive coolant that, when mixed with coolant 120, provide increased cooling, thereby extinguishing the thermal runaway event quicker that coolant 120 could achieve alone. The shield layer can be any polymeric material such as, but not limited to, a Poly (4-aminocyclohexyleneacetic acid); a Poly (1,4-cyclohexylene adipamide); a Poly (acrylonitrile); a syndiotactic polymer; or a polysulfone. As used herein, the term "microcapsule" is used to refer to capsules that are in a range of about 10 microns to 1000 microns in diameter. However, it will be appreciated that the following disclosure may be applied to capsules having a smaller size (also referred to as "nanocapsules").

The shield layer material should be selected to have a melting point equal to or greater than expected temperatures of a thermal runaway event (i.e., approximately 160° C.). For example, Poly (acrylonitrile) has a melt temperature of approximately 200° C.). In various embodiments, coolant 120 comprises, is mixed with, or otherwise contains a first reactant and microcapsules 122*a* contain a second reactant. When the shield ruptures (as depicted in FIG. 4B as ruptured microcapsules 122*b*), the first and second reactants mix and create an endothermic reaction, providing further extinguishing of the thermal runaway event occurring in component 140. For example, the first reactant may be water, where coolant 120 comprises entirely of water and microcapsules 122*a* include ammonium nitrate as a second reactant. When the shield layer bursts as component 140 reaches thermal runaway event temperatures, the water and ammonium nitrate mix creating an endothermic reaction, further increasing the efficacy of extinguishment of the thermal runaway event. Other reactant pairs may include, but are not limited to, barium hydroxide/ammonium thiocyanate or thionyl chloride/cobalt sulfate heptahydrate. One of ordinary skill in the art will appreciate that any mixture of reactants that provide endothermic reactions when mixed can be used without deviating from the invention.

Figure 5:
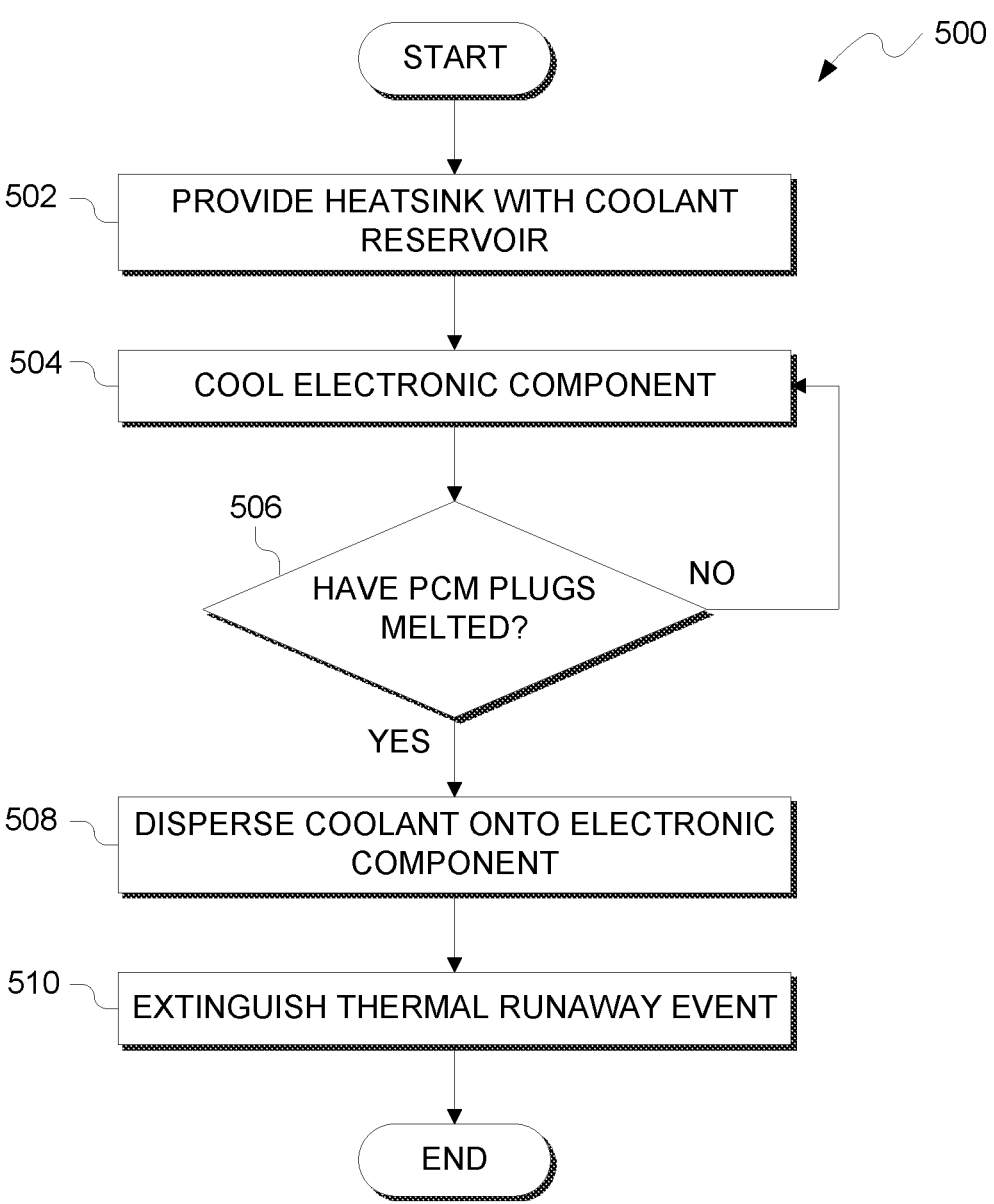
FIG. 5 illustrates an example process of utilizing the heatsink with extinguishing coolant, the heatsink with extinguishing coolant and piping, the heatsink with extinguishing coolant and containment walls, and the heatsink with extinguishing coolant containing microcapsules.

FIG. 5 illustrates an example process, generally designated 500, of utilizing the heatsink with extinguishing coolant 100, heatsink with extinguishing coolant and piping 200, heatsink with extinguishing coolant and containment walls 300, and heatsink with extinguishing coolant containing microcapsules 400. As discussed herein, heatsink 130 is affixed to electronic component 140. In some scenarios, electronic component 140 may overheat and suffer a thermal runaway event, typically occurring in integrated circuit packages at approximately 160° C. When this occurs, coolant 120 is dispersed onto electronic component 140 to extinguish and contain the thermal runaway event from damaging other components.

In step 502, heatsink 130 with reservoir 110 storing coolant 120 is affixed to the electronic component 140. Under normal operating temperature, heatsink 130 operates in a typical fashion, providing cooling to electronic component 140 (step 504). Since heatsink 130 is affixed to electronic component 140, heat produced by the electronic component 140 induce heat onto the thermal interface between electronic component 140 and heatsink 130. As such, with PCM plugs 114 placed in proximity to the electronic component 140, PCM plugs 114 will also be heated by electronic component 140.

In evaluation step 506, when the electronic components 140 reaches high enough temperatures induce enough heat to melt intact PCM plugs 114*a*, creating melted PCM plugs 114*b*. If PCM plugs 114 are not heated to a melting point (NO Branch of evaluation step 506), then PCM plugs 114*a* remain intact, keeping coolant 120 in reservoir 110. However, once the intact PCM plugs 114*a* are exposed to temperatures that cause the plugs to melt (YES branch of evaluation step 506), then coolant 120 is no longer blocked by PCM plugs 114. In step 508, once PCM plugs 114 have melted the PCM plugs 114 no longs block reservoir 110, causing coolant 120 to be dispersed onto electronic component 140. Once coolant 120 is dispersed, the thermal runaway event will be extinguished (step 510), thereby preventing any further damage caused by the event.

What is claimed is:
1. An apparatus for dispersing localized coolant to an electronic component to protect in an event of thermal runaway, the apparatus comprising:
a heatsink affixed to the electronic component;
a reservoir in the heatsink, the reservoir containing the coolant and having a drain;

a Phase Change Material (PCM) plug located close to the electronic component, the PCM plug being affixed to the drain and blocking release of the coolant contained in the reservoir; and
diverting channels, wherein at least one diverting channel directs at least a portion of the coolant directly to a side of the electronic component,
wherein:
in response to a temperature of the electronic component being at a Phase Change Temperature (PCT) of the PCM plug, the PCM plug melting thereby allowing release of the coolant to pass through the drain and to disperse via the diverting channels onto the electronic component.
2. The apparatus of claim 1, wherein the PCT of the PCM plugs is a temperature that would cause a thermal runaway event in the electronic component.
3. The apparatus of claim 1, the apparatus further comprising:
a perimeter wall, wherein the perimeter wall surrounds the electronic component.
4. The apparatus of claim 3, wherein the perimeter wall contains the coolant within an area surrounding the electronic component.
5. The apparatus of claim 1, the apparatus further comprising:
a plurality of microcapsules mixed with the coolant, wherein the microcapsules rupture at the PCT of the PCM plugs.
6. A method for extinguishing a thermal runaway event in an electronic component, the method comprising:
affixing a heatsink to the electronic component, the heatsink including:
a reservoir containing a coolant,
a drain for releasing the coolant from the reservoir,
a phase change material (PCM) plug blocking the drain from releasing the coolant, and
diverting channels connected to the drain for directing released coolant wherein at least one diverting channel is configured to direct at least a portion of the released coolant to a side of the electronic component;
in response to the electronic component reaching a temperature indicative of the thermal runaway event in the electronic component, melting the PCM plug; and
in response to the PCM plug melting, releasing the coolant through the drain and dispersing at least a portion of the released coolant through the at least one diverting channel onto the side of the electronic component, the dispersing of the coolant through the diverting channels thereby extinguishing the thermal runaway event.
7. The method of claim 6, wherein a phase change temperature (PCT) of the PCM plug is the temperature indicative of the thermal runaway event in the electronic component.
8. The method of claim 6, wherein the reservoir is enclosed by the heatsink affixed to the electronic component.
9. The method of claim 6, further comprising:
providing a perimeter wall surrounding the electronic component.
10. The method of claim 9, wherein the perimeter wall contains the released coolant within an area surrounding the electronic component.

US 12,677,396 B2

9

10

11. The method of claim 6, wherein the coolant includes a plurality of microcapsules configured to rupture at a phase change temperature PCT) of the PCM plugs.

\* \* \* \* \*